United States Patent
Horak et al.

(10) Patent No.: US 7,795,068 B2
(45) Date of Patent: Sep. 14, 2010

(54) METHOD OF MAKING INTEGRATED CIRCUIT (IC) INCLUDING AT LEAST ONE STORAGE CELL

(75) Inventors: David V. Horak, Essex Junction, VT (US); Chung H. Lam, Peekskill, NY (US); Hon-Sum P. Wong, Chappaqua, NY (US)

(73) Assignee: International Business Machines Corporation, Armonk, NY (US)

(*) Notice: Subject to any disclaimer, the term of this patent is extended or adjusted under 35 U.S.C. 154(b) by 139 days.

(21) Appl. No.: 12/136,158

(22) Filed: Jun. 10, 2008

(65) Prior Publication Data

US 2008/0248624 A1 Oct. 9, 2008

Related U.S. Application Data

(62) Division of application No. 10/732,580, filed on Dec. 10, 2003.

(51) Int. Cl.
*H01L 21/00* (2006.01)
*H01L 21/06* (2006.01)

(52) U.S. Cl. .................. 438/95; 438/253; 438/382; 438/396; 438/597; 257/2; 257/3; 257/4; 257/5; 257/E31.015; 257/E31.029; 257/E45.002; 257/E47.001; 257/E47.005

(58) Field of Classification Search .............. 438/95, 438/253, 382, 396, 597; 257/2, 3, 4, 5, E31.015, 257/E31.029, E45.002, E47.001, E47.005
See application file for complete search history.

(56) References Cited

U.S. PATENT DOCUMENTS

| | | | |
|---|---|---|---|
| 5,920,788 A | 7/1999 | Reinberg | |
| 6,074,516 A * | 6/2000 | Howald et al. | 156/345.24 |
| 6,507,061 B1 | 1/2003 | Hudgens et al. | |
| 6,586,761 B2 | 7/2003 | Lowrey | |
| 6,849,868 B2 * | 2/2005 | Campbell | 257/35 |
| 6,908,812 B2 * | 6/2005 | Lowrey | 438/253 |
| 6,937,507 B2 | 8/2005 | Chen | |
| 7,012,273 B2 * | 3/2006 | Chen | 257/4 |

OTHER PUBLICATIONS

T. M. Mayer, "Simulation of plasma-assisted etching processes by ion-beam techniques", J. Vac. Sci. Technol., 21(3), 1982.*

* cited by examiner

*Primary Examiner*—Dao H Nguyen
(74) *Attorney, Agent, or Firm*—Law Office of Charles W. Peterson, Jr.; Wan Yee Cheung, Esq.; Vazken Alexanian

(57) ABSTRACT

A storage cell, integrated circuit (IC) chip with one or more storage cells that may be in an array of the storage cells and a method of forming the storage cell and IC. Each storage cell includes a stylus, the tip of which is phase change material. The phase change tip may be sandwiched between an electrode and conductive material, e.g., titanium nitride (TiN), tantalum nitride (TaN) or n-type semiconductor. The phase change layer may be a chalcogenide and in particular a germanium (Ge), antimony (Sb), tellurium (Te) (GST) layer.

9 Claims, 7 Drawing Sheets

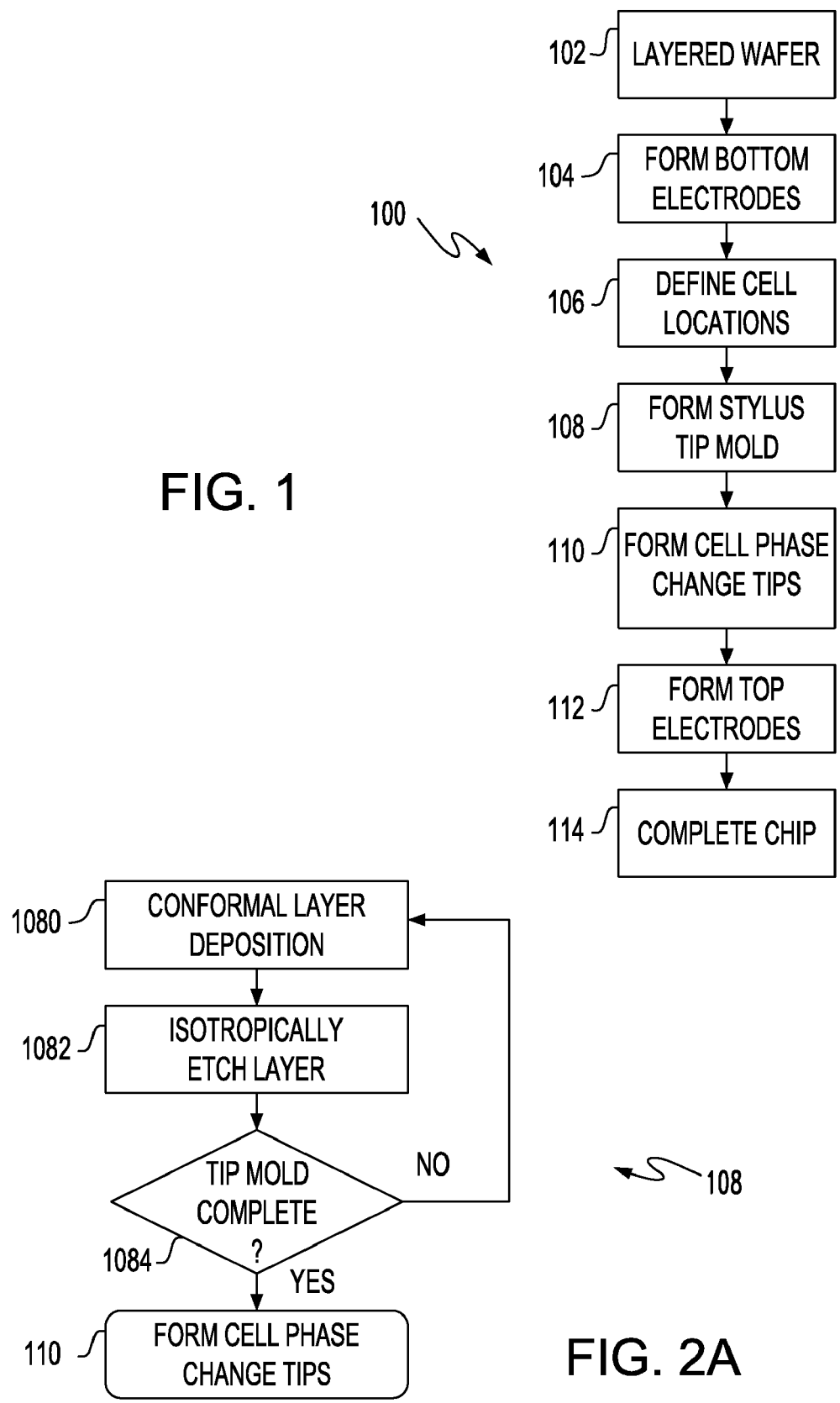

METHOD OF MAKING INTEGRATED CIRCUIT (IC) INCLUDING AT LEAST ONE STORAGE CELL

CROSS REFERENCE TO RELATED APPLICATION

The present invention is a divisional application of copending U.S. application Ser. No. 10/732,580 "PHASE CHANGE TIP STORAGE CELL" to David V. Horak et al., and related to U.S. application Ser. No. 10/732,582 "FIELD EMISSION PHASE CHANGE DIODE STORAGE ELEMENT AND MEMORY" to Stephen S. Furkay et al., now issued as U.S. Pat. No. 7,052,923 B2, and U.S. application Ser. No. 10/732,579 "INTEGRATED CIRCUIT WITH UPSTANDING STYLUS" to David V. Horak et al., all filed Dec. 10, 2003, and assigned to the assignee of the present invention.

BACKGROUND OF THE INVENTION

1. Field of the Invention

The present invention is related to solid state storage and particularly to solid state storage cells with a phase change material memory element.

2. Background Description

Solid state, phase change materials that are chalcogen (Group VI elements such as sulfur (S), selenium (Se) and tellurium (Te)) alloys with at least one of germanium (Ge), arsenic (As), silicon (Si) and antimony (Sb) are known as chalcogenides and are well known. Chalcogenides exist in at least two different classifiable solid states or phases. The most extreme two states can be classified simply as amorphous and crystalline states with other less easily discernable states ranging between those two states. The amorphous state has a disordered atomic structure and the crystalline state generally is polycrystalline. Each phase has very different electrical properties. In its amorphous state, the material behaves as an insulator, i.e., an open circuit; in its crystalline state, the same material behaves resistively, as a p-type semiconductor. The resistivity of these materials varies in between amorphous and crystalline states.

In particular, when heat is applied to some phase change chalcogenides, the material switches phases from one (e.g., amorphous phase) state to a second (e.g., crystalline phase) state. The transitions between these states is selectively reversible with heat, i.e., the phase change material may be set/reset. As with anything that has two or more discernable and selectable states, each of the 2 stable states can be designated as a logic one and the other a logic zero. Thus, phase change material has found use in storage devices and particularly, for non-volatile storage, e.g., as a memory cell storage media. In addition, multiple bit memory elements have been made using the intermediate states inherent in the variation in resistivity between amorphous and crystalline.

Typically, controlled heat must be precisely provided to the phase change storage media to effect reversible transitions between amorphous and crystalline states and back. Normally, such heat is provided using resistive heating. Unfortunately, a relatively large current is needed for each memory element to heat the phase change material. In particular, resetting the phase change material may require heating the crystalline material to its melting point, generally above 600° C. Thus, it maybe difficult on one hand to provide sufficient localized heat to raise the crystalline phase change material to its melting point and, on the other hand, to avoid accidentally heating other adjacent cells to the phase change set point and inadvertently setting adjacent cells.

One prior approach to localize heating in phase change switching is to minimize the phase change material contact area. Unfortunately, reducing the contact area normally increases cost, which is inversely proportional to the size of the contact. In particular, attaining a contact size below the minimum photolithographic image size for a particular technology complicates the process significantly and, correspondingly, increases cost. Further, normally, reducing contact size, reduces the heat delivery capability and increases resistance/reduces current delivered to the phase change material; all of which interferes with setting/resetting the material rather than enhancing it.

Thus, there is a need for improved and very localized or focused heat delivery to phase change material in memory cells.

SUMMARY OF THE INVENTION

It is a purpose of the invention to improve heat delivery to phase change material in memory cells;

It is another purpose of the invention to focus heat delivered to phase change material in individual memory cells;

It is yet another purpose of the invention to reduce the power required to deliver sufficient heat to set and reset phase change material in individual memory cells.

The present invention relates to a storage cell, integrated circuit (IC) chip with one or more storage cells that may be in an array of the storage cells and a method of forming the storage cell and IC. Each storage cell includes a stylus, the tip of which is phase change material. The phase change tip may be sandwiched between an electrode and conductive material, e.g., n-type semiconductor. The phase change layer may be a chalcogenide and in particular a germanium (Ge), antimony (Sb), tellurium (Te) or GST alloy.

BRIEF DESCRIPTION OF THE DRAWINGS

The foregoing and other objects, aspects and advantages will be better understood from the following detailed description of a preferred embodiment of the invention with reference to the drawings, in which:

FIG. 1 shows a flow diagram for an example of a method of forming a preferred embodiment cross point array of nonvolatile storage devices;

FIGS. 2A-B show an example of a preferred method of forming tip molds for cells and styli with phase change tips;

DESCRIPTION OF PREFERRED EMBODIMENTS

Figure 2B:
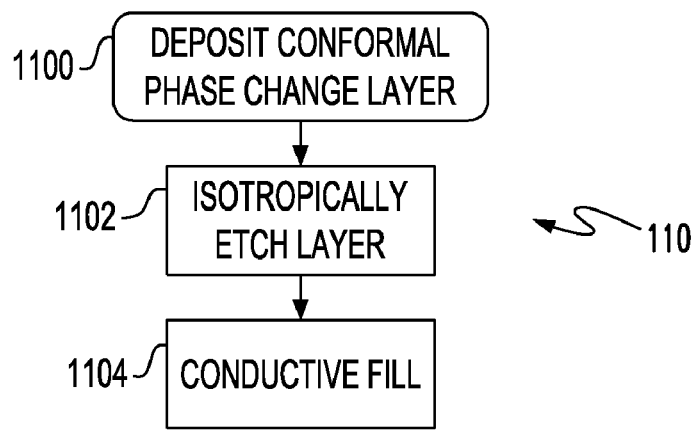

Turning now to the drawings and more particularly, FIG. 1 shows a flow diagram for an example of a method 100 of forming preferred embodiment nonvolatile storage devices according to the present invention, e.g., in a cross point storage array. In particular, preferred embodiment devices have chalcogenide phase change storage media in a stylus tip with a focused heating field in the stylus for enhanced Joule heating power delivery that improves phase change alteration. Preferably, Joule heating delivery is enhanced by delivering heat through and to the phase change material in the tip or apex of the stylus. In particular during a write, the hottest stylus region is spaced away from the bulk of the stylus and at the apex and so, contained entirely within the phase change material.

Cell formation begins in step 102 with a layered wafer. In particular, the layered wafer may be a partially patterned integrated circuit with standard insulated gate field effect transistor (FET) technology circuit devices, commonly referred to as CMOS. Storage cells are formed as described hereinbelow between 2 conductor layers, referred to as top and bottom electrode layers. Further, circuit devices, both N-type FETs (NFETs) and P-type FETs (PFETs), may be connected together by wiring that may be, in part, on one or both of the 2 conductor layers. So, in step 104 bottom electrodes are formed in a conductor layer at the surface of the layered wafer. Then in step 106, a field layer is formed on the bottom electrode layer and orifices are formed in the field layer to define cell locations. In step 108 a tip or stylus mold is formed in each of the cell locations. The tip mold is such that a preferred stylus or field tip forms pointing down into the wafer and toward the bottom electrodes, e.g., described in U.S. application Ser. No. 10/732,579 entitled "INTEGRATED CIRCUIT WITH UPSTANDING STYLUS" to David V. Horak et al., filed coincident herewith, assigned to the assignee of the present invention and incorporated herein by reference. In step 110, a stylus is formed in each cell location with phase change material contained in and forming the tip of the stylus. Then in step 112, the array is completed when top electrodes are formed over the cells. By orienting the bottom electrodes in one direction and the top electrodes in a second, each cell is uniquely identifiable by the intersection of one bottom electrode with one top electrode. Finally in step 114, using standard semiconductor manufacturing end of the line (EOL) steps, the memory (macro, chip, etc.) is completed.

It should be noted that heretofore, stylus shaped field tips have been formed using a hard mask and a wet etch to define tips upstanding like stalagmites, standing on and pointing upward from the wafer. By contrast, a preferred embodiment stylus shaped field tip is formed inverted from these stalagmite shaped styli, i.e., effectively standing on the stylus apex with storage material contained within the tip, itself. Further, it should be noted that a preferred embodiment stylus with a phase change tip is suitable for any storage cell or memory cell application and has use beyond memory cell applications. For example, such a stylus has application to any circuit or chip wherein non-volatile storage may be needed, e.g., programmable logic arrays (PLAs), programmable array logic (PAL), programmable chip selects or even, circuits with programmable performance tailoring.

FIGS. 2A-B show an example of a preferred method of forming tip molds for cells step 108 and styli with phase change tips in step 110. The tip mold is formed by depositing successive dielectric layers and isotropically etching to remove horizontal portions of each. So, beginning in step 1080 a first conformal spacer layer is deposited. In particular, the conformal spacer layers may be silicon nitride (e.g., $Si_3N_4$) or oxide. Silicon nitride can be deposited with a mixture of ammonia and silicon hydride using plasma enhanced chemical vapor deposition (PECVD) or in a furnace reactor at a pressure of between about 10 milliTorr (10 mTorr) and 1 Torr. Deposition thickness can be time controlled. Alternately, oxide can be deposited by flowing ozone and tetraethylorthosilicate (TEOS) into a deposition reactor. Preferably, the wafer temperature in each such deposition is between about 300° and 500° C. and under a pressure between about 10 and 400 Torr. Deposition thickness is time controlled. Next, in step 1082 each layer is anisotropically etched, preferably with a plasma etch, to remove horizontal surfaces of the conformal layer, which also slightly reduces the height of the vertical sidewall spacer that remains in the orifice. Each additional layer is deposited and etched, repeating steps 1080 and 1082, until the tip mold is complete in step 1084; the layered spacers form the tip mold. Stylus formation begins in step 1100 FIG. 2B with depositing a conformal phase change layer. The conformal phase change layer is isotropically etched in step 1102, leaving a phase change tip in the tip mold. The volume or the remaining storage material is minimal and as long as enough remains to form a crystal and exist amorphously, enough remains in the tip. The stylus is completed in step 1104 the mold is filled by depositing a conductive material, preferably, titanium nitride (TiN) or tantalum nitride (TaN) or alternately, n-type semiconductor. Typically, the conductive fill is planarized, e.g., CMP, to the upper surface of the field layer and tip mold for top electrode formation thereon.

Figure 3:
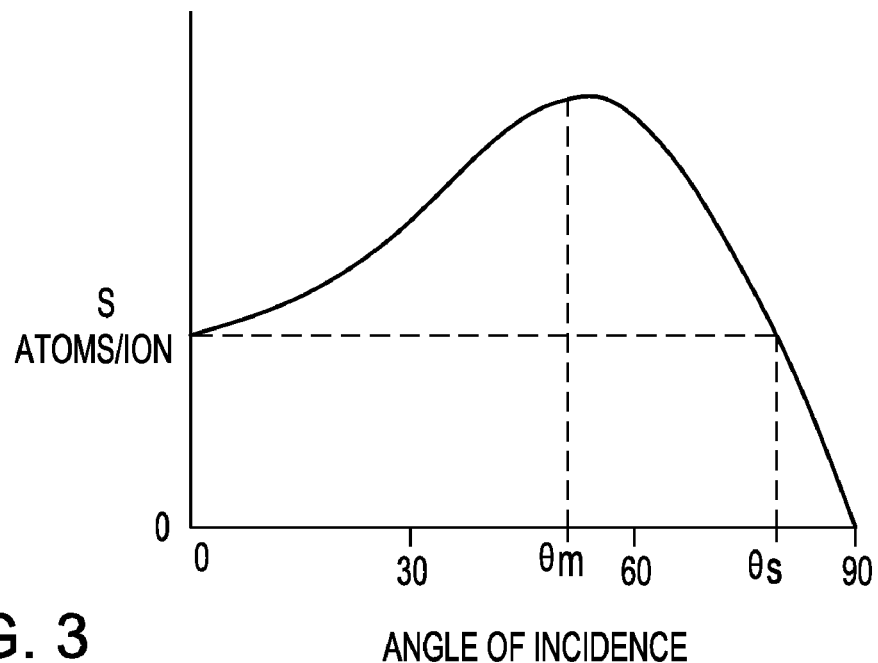
FIG. 3 shows that a plasma etch with enhanced sputtering enhances preferential erosion of horizontal layers.

FIG. 3 shows plasma etch sputtering yield with respect to target normal, which shows that enhancing sputtering enhances preferential erosion of horizontal layers with a maximum occurring at a sputtering angle ($\theta_m$) of about 50° across an angular range of 0 to an upper angular limit ($\theta_s$) of about 80°. So, if in step 1082 and 1102 the isotropic etch does not have a sputtering component, the curvature of the deposited conformal film normally would translate to the spacer that will become part of the tip mold. However, enhanced sputtering enhances preferential plasma erosion of the horizontal portions of the conformal layer for a more pronounced sidewall curvature. The more pronounced the sidewall curvature, the more pronounced the tip mold and the tip itself. So, to enhance sputtering during the plasma etch, the wafer is biased (either with a self bias or using an appropriate external DC bias) with respect to plasma. In particular, the conformal layer may be etched in step 1104 in a plasma reactor at pressures between 1 and 250 mTorr using a fluorinated plasma, e.g., using feed gasses such as $CHF_3$, $CF_4$ and/or $O_2C_2F_6$.

FIGS. 4A-G show a cross sectional example of a preferred stylus tip cell formed according to the preferred method of FIG. 2A-B. In this example, an orifice 200 in a surface layer 202 to an underlying (bottom) electrode layer 204. Preferably, the orifice 200 has a circular horizontal cross section. Tip formation in step 108 of FIG. 2A as successive conformal layers are deposited in step 1080 and isotropically etched in step 1082 to form sidewall spacers 206, 208, forming a ring around the interior of the orifices 200. Preferably, for a 125 nm diameter memory cell, successive 15 nm thick layers are deposited for each of sidewall spacers 206, 208. Again in step 1080, a third 15 nm thick conformal layer 210, is deposited completing the cross section in the example of FIG. 4A. After isotropically etching third conformal layer 210 in step 1082, a third spacer 212 is formed in FIG. 4B, also forming a ring around the interior of the orifice 200. Similarly, in FIG. 4C, a fourth 15 nm thick conformal layer 214 is formed in step 1080 and isotropically etched in step 1082 to form fourth spacers 216 in FIG. 4D, which completes a tapered mold in the orifice 200. It should be noted that although spacer rings 206, 208, 212 and 216 are shown as individual layers, this is primarily for illustration. If such spacers 206, 208, 212 and 216 are the same material, once formed, each would merge with previously formed spacer rings for a uniform, rather than layered, tip mold 218.

It should be noted that if an isotropic etch is employed that does not have a sputtering component, normally, the spacer would have the curvature of the deposited conformal film. Further, height is removed from each spacer 206, 208, 212 and 216 as it is slightly etched down with horizontal portion removal. Accordingly, the combined after etch thickness of the four spacers must be less than half the width of the orifice and may extend the full height of the orifice 200 to avoid plugging the orifice 200.

Figure 4A:
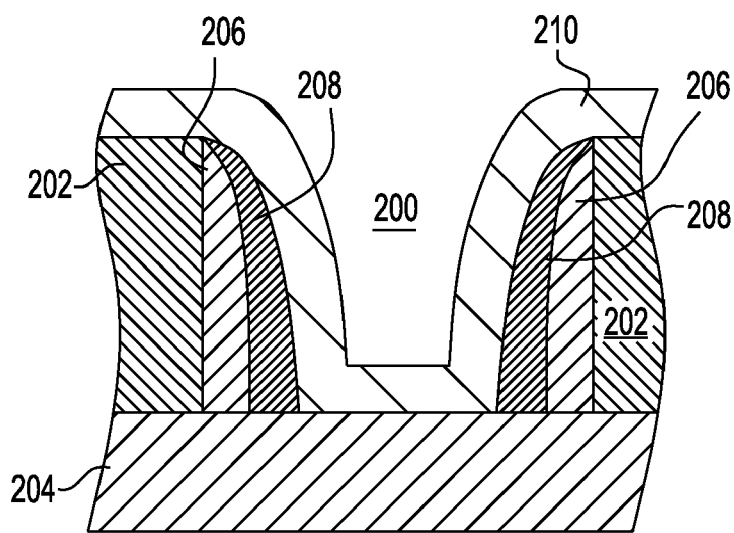
FIGS. 4A-G show a cross sectional example of a preferred stylus tip cell.
Figure 4B:
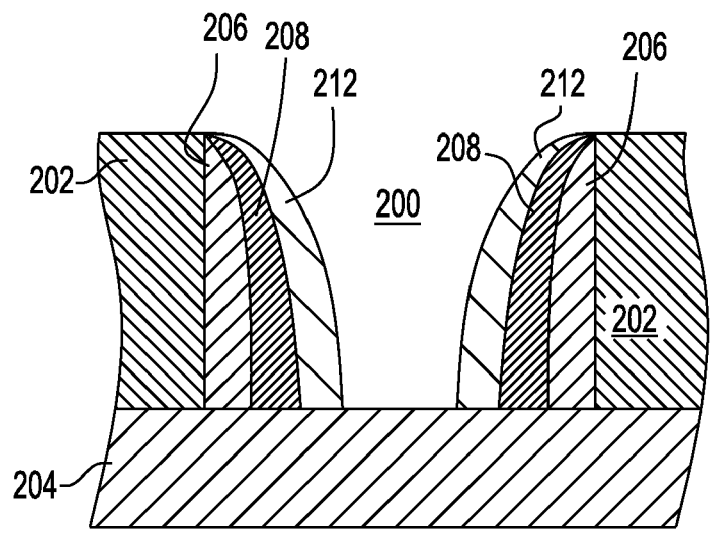
Figure 4C:
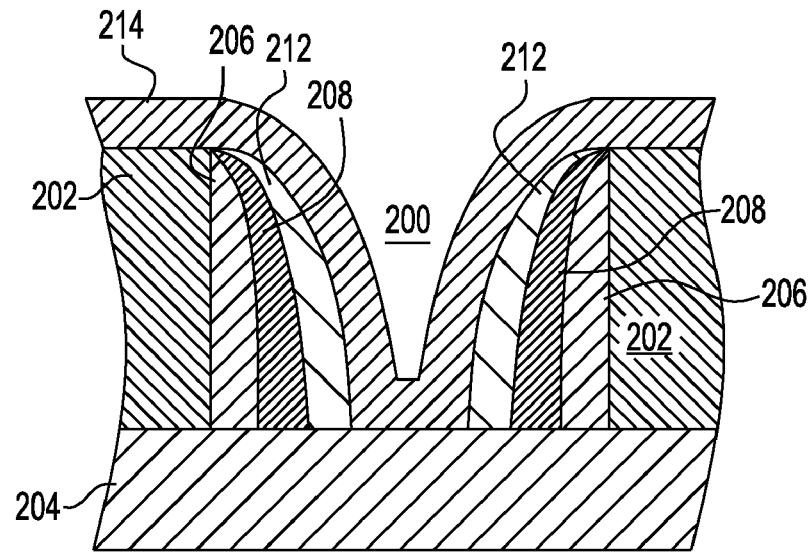
Figure 4D:
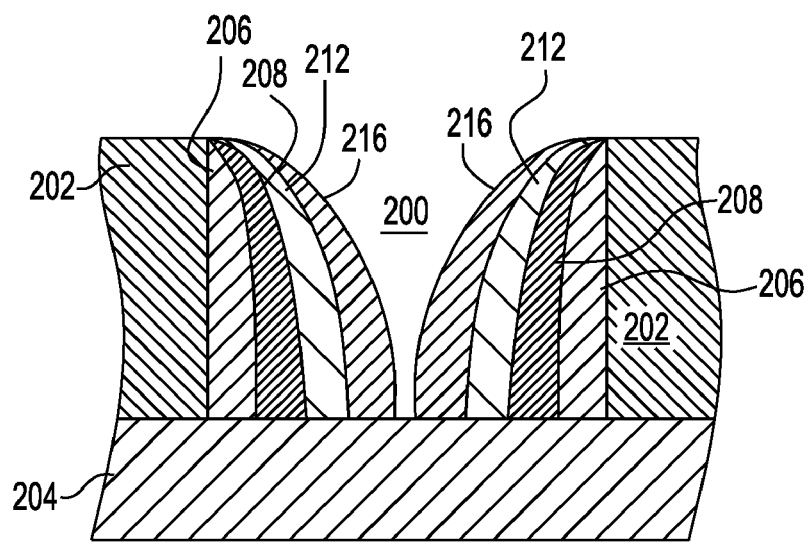
Figure 4E:
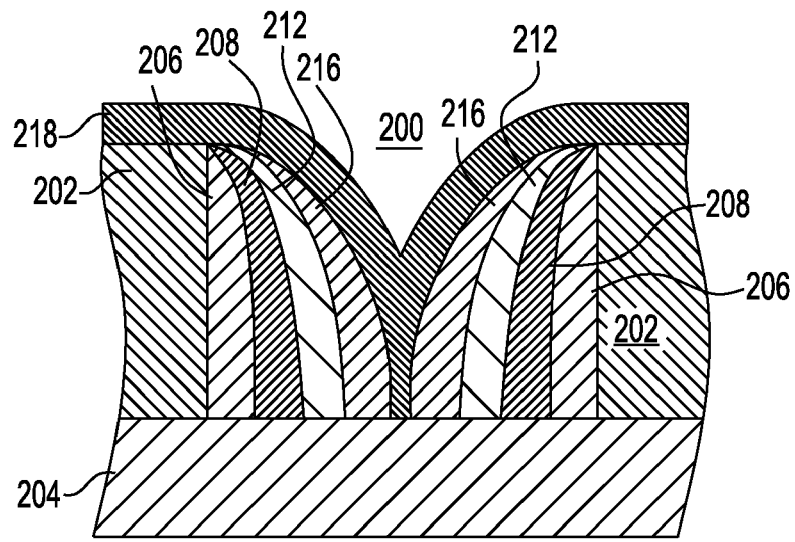
Figure 4F:
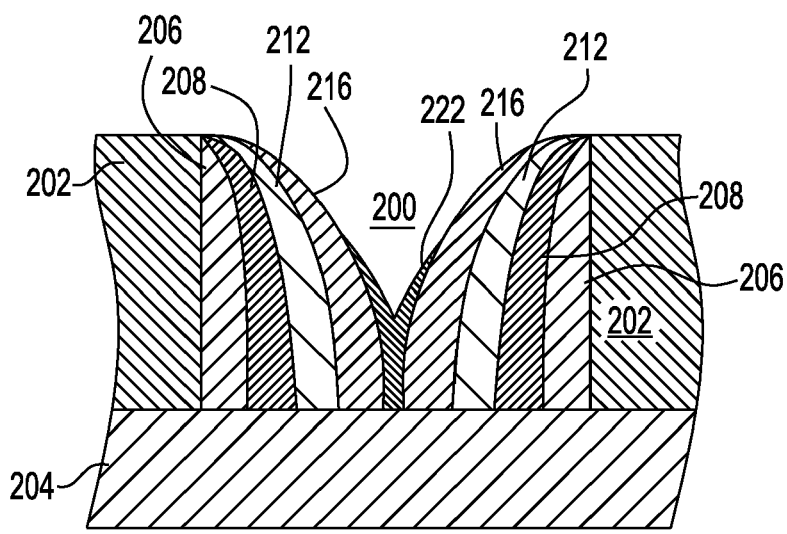
Figure 4G:
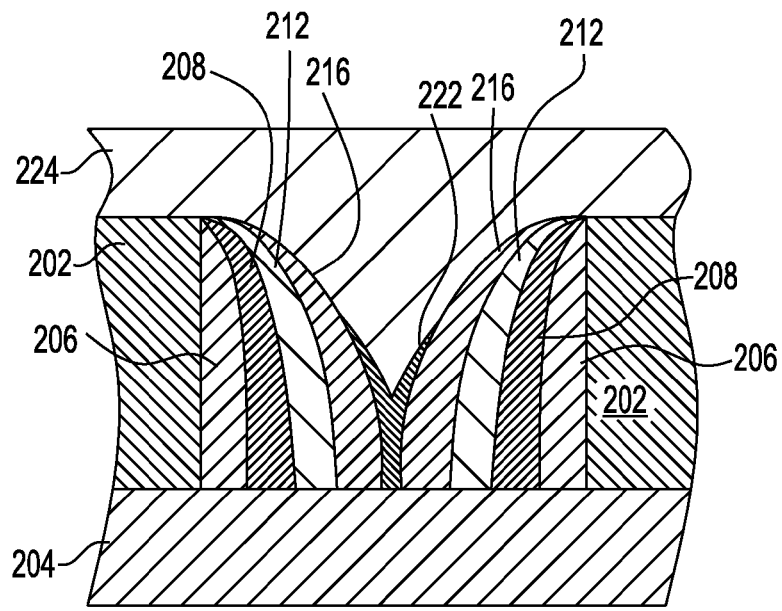

Stylus tip cell formation in step 110 of FIG. 2B begins in step 1100 as shown in FIG. 4E as a phase change material layer 218, preferably a conformal layer, is deposited in the orifice 200. Optionally, a conductive barrier layer (e.g., TiN, not shown) may be formed on the bottom electrode 204 before or after mold formation and before the step 1100 of depositing the conformal phase change material layer 218. The phase change material layer 218 contacts the bottom electrode 204, directly or indirectly, e.g., through a conductive barrier layer (not shown). Then, in step 1102 using RIE for example, the horizontal portions of phase change layer 218 are removed, leaving a phase change tip 222 in the orifice. In this example, the phase change tip 222 volume is minimized with a cross section shaped similar to an arrowhead. Finally, in step 1104 the orifice is filled with conductive material 224, plugging the mold and completing the stylus. As noted herein above, preferably, conductive material 224 is, preferably, TiN or TaN and, alternately, an n-type semiconductor. The phase change tip 222 is sandwiched between the conductive material 224 (which may be formed with and act as a top electrode) and the bottom electrode 204. In particular, in its crystalline phase, the phase change tip 222 is an asymmetric resistor in the current path between the conductive material 224 and the bottom electrode 204 and favors electron conduction when the top electrode is biased negatively with respect to the bottom electrode. In its amorphous phase, the phase change tip 222 acts as an insulator, i.e., opening the current path. Thus, analogous to old diode based read only memories (ROM), a one and a zero can be represented by the absence and presence of asymmetric resistance (i.e., of crystalline phase change material) in the path or vice versa. Thereafter, processing continues in step 112 of FIG. 1 as the conductive material fill 224 is planarized, e.g., CMP, leaving a conductive plug completing each stylus and top electrodes are formed. Optionally, the conductive material fill 224 may be patterned to integrally form the top electrodes with the conductive plugs.

Figure 5A:
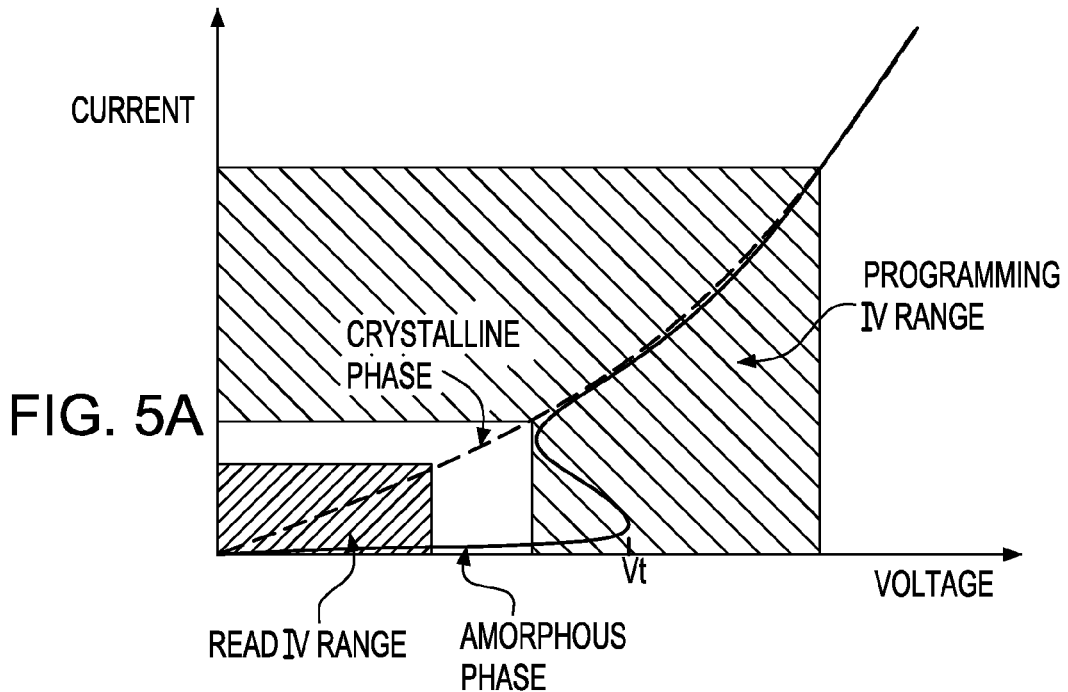
FIG. 5A shows an example of a current verses voltage (I-V) characteristic for a typical chalcogenide suitable as a phase change memory material for preferred embodiment cross point cells.
Figure 5B:
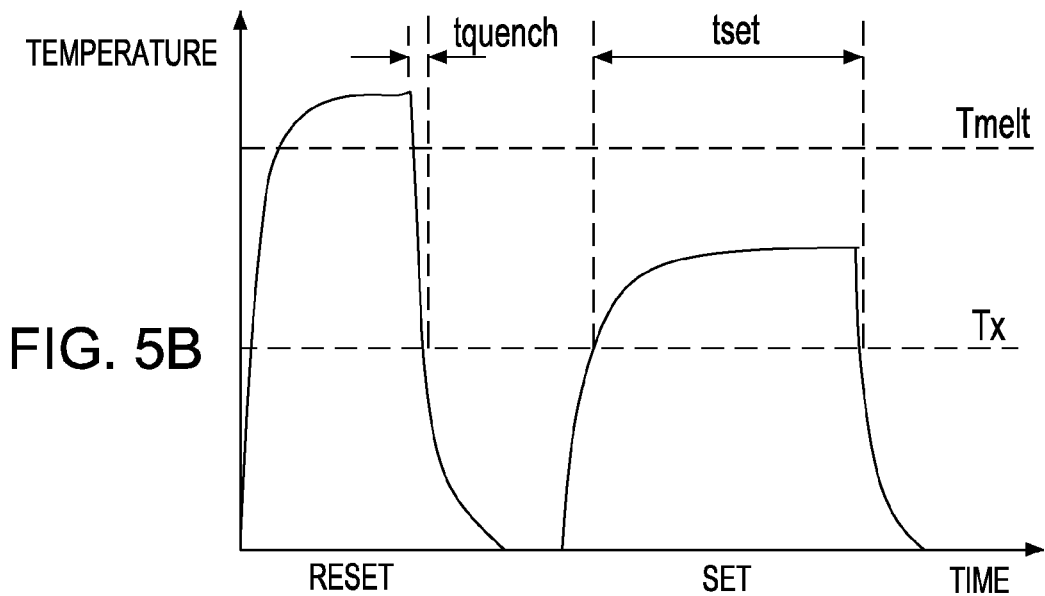
FIG. 5B shows an example of typical chalcogenide memory programming temperature evolution profiles for preferred embodiment cross point cells.

FIG. 5A shows an example of a current verses voltage (I-V) characteristic for a typical chalcogenide suitable as a phase change memory material for preferred embodiment cross point cells. FIG. 5B shows an example of typical chalcogenide memory programming temperature evolution profiles for preferred embodiment cross point cells. Joule heating is applied to the cell GST tip to switch phases: switching to its amorphous (RESET) phase by heating the GST to $T_{melt}$ and allowing it sufficient time to cool ($t_{quench}$); and, alternately, crystallizing (SET) the GST by heating it to $T_x$ and allowing it sufficient time to cool ($t_{set}$). Thus, by switching the GST tip between crystalline and amorphous phase and back, the stylus switches from including a diode junction and being an open between the top electrode and bottom electrode and back. So, for example, amorphous GST may be a logic zero and crystalline GST may be a logic one.

Figure 6:
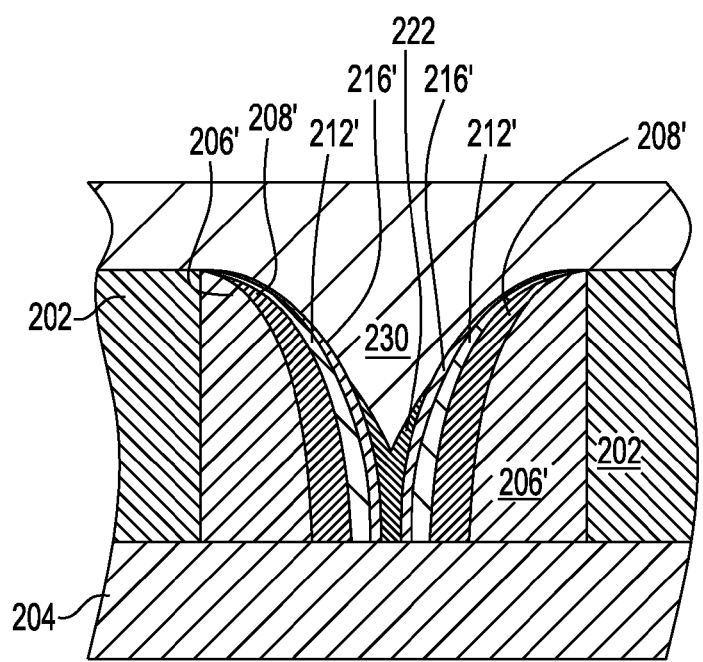
FIG. 6 shows a cross-section of another example of forming a stylus by depositing sequentially thinner layers such that spacers decrease in thickness axially.

FIG. 6 shows a cross-section of another example of a preferred stylus 230 formed by depositing sequentially thinner layers such that spacers decrease in thickness axially, i.e., the initial spacer layer is much thicker than the final spacer layer. In this example the first or outer layer 206' is substantially thicker than the inner layers 208', 212' and 216'. In particular the outer layer 206' is from one quarter to one third the thickness of the horizontal dimension of the orifice. Subsequent spacer layers are each one quarter to one third as thick as the remaining opening at the bottom part of the spacer 208'. So, the effective thickness of each succeeding layer decreases geometrically the with the number of layers. Finally, a stylus tip and conductive material are deposited to form the stylus 230 in the tapered mold.

Advantageously, by depositing the phase change material layer in the mold and etching the layer so that only the phase change tip remains, the phase change material is volume limited and concentrated in the stylus tip, bounded on all sides by the tip mold and on top by the conductor to the top electrode. So, the energy required to change phases is minimized because heat generated for setting/resetting the phase change material tip is, more or less, contained within the phase change material itself. Also, the memory cell has a more controlled resistance due to the limited for phase change material volume. Additionally, the tip mold material is a better heat insulator than conductor, which in combination with the conductive plug focuses the heat delivered to the cell on changing the phase, further improving device switching efficiency.

While the invention has been described in terms of preferred embodiments, those skilled in the art will recognize that the invention can be practiced with modification within the spirit and scope of the appended claims.

What is claimed is:

1. A method of forming an integrated circuit (IC) including at least one storage cell, said method comprising the steps of:
    a) forming a bottom electrode on a layered wafer;
    b) defining a tip mold above a respective bottom electrode at each cell location, comprising the steps of:
        i) forming a conformal layer on a surface layer of said layered wafer;
        ii) removing horizontal portions of said conformal layer from said surface layer; and
        iii) repeating steps (i) and (ii) 3 times, whereby four concentric spacer layers form said tip mold;
    c) forming a cell tip of a phase change material in each defined said tip mold; and
    d) filling said each defined tip mold with a conductive material.

2. A method of forming an IC as in claim 1, wherein the step (c) of forming the cell tip comprises the steps of:
    i) depositing a conformal phase change material layer; and
    ii) removing horizontal portions of said conformal phase change material layer.

3. A method of forming an IC as in claim 2, wherein the step (ii) of removing horizontal portions comprises etching said conformal phase change material layer with a plasma etch having an enhanced sputtering component.

4. A method of forming an IC as in claim 3, wherein said IC is on a layered wafer and the step (ii) of removing horizontal portions comprises biasing said layered wafer during said plasma etch, biasing said layered wafer enhancing sputtering.

5. A method of forming an IC as in claim 4, wherein said layered wafer is self biased.

6. A method of forming an IC as in claim 4, wherein said chalcogenide is a germanium (Ge), antimony (Sb), tellurium (Te) based (GST based) material.

7. A method of forming an IC as in claim 3, wherein said phase change layer is a chalcogenide layer.

8. A method of forming an IC as in claim 3, wherein said conductive material comprises a metal nitride.

9. A method of forming an IC as in claim 1, wherein each succeeding said conformal layer is formed thinner than its immediately preceding layer.

* * * * *